United States Patent
Kajiyama (10) Patent No.: US 7,741,688 B2
(45) Date of Patent: Jun. 22, 2010

(54) MAGNETIC RANDOM ACCESS MEMORY AND METHOD OF MANUFACTURING THE SAME

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 11/797,530

(22) Filed: May 4, 2007

(65) Prior Publication Data

US 2008/0089118 A1 Apr. 17, 2008

(30) Foreign Application Priority Data

Oct. 13, 2006 (JP) .............................. 2006-280481

(51) Int. Cl.
*H01L 21/00* (2006.01)
(52) U.S. Cl. .................................... 257/421
(58) Field of Classification Search .......... 257/E21.665, 257/E27.005–E27.006, E43.001–E43.007, 257/295, E27.008, E29.164, E29.167, E29.272, 257/E29.323, E27.104, E21.208, E21.663, 257/E21.664; 365/171, 258, 182; 438/3, 438/785
See application file for complete search history.

(56) References Cited

U.S. PATENT DOCUMENTS

| | | | | |
|---|---|---|---|---|
| 7,002,839 B2 * | 2/2006 | Kawabata et al. | ............ | 365/171 |
| 7,099,185 B2 * | 8/2006 | Yamamoto et al. | ........... | 365/158 |
| 7,116,575 B1 * | 10/2006 | Katti | ........................ | 365/158 |
| 7,120,048 B2 * | 10/2006 | Sundstrom | .................. | 365/158 |
| 2003/0107057 A1 * | 6/2003 | Komori | ...................... | 257/241 |
| 2003/0169147 A1 * | 9/2003 | Higo | ........................ | 338/32 R |
| 2003/0183889 A1 * | 10/2003 | Kajiyama | ................... | 257/421 |
| 2004/0166640 A1 * | 8/2004 | Yagami et al. | .............. | 438/277 |

FOREIGN PATENT DOCUMENTS

| | | |
|---|---|---|
| JP | 2001-84758 | 3/2001 |
| JP | 2003-273331 | 9/2003 |
| JP | 2004-139681 | 5/2004 |
| JP | 2004-193479 | 7/2004 |
| JP | 2004-259913 | 9/2004 |

OTHER PUBLICATIONS

M. Hosomi et al., "A Novel Nonvolatile Memory with Spin Torque Transfer Magnetization Switching: Spin-RAM," Tech. Dig. Int. Electron Devices Meeting, Washington, DC, pp. 459-462 (2005).

* cited by examiner

*Primary Examiner*—Dao H Nguyen
*Assistant Examiner*—Tram H Nguyen
(74) *Attorney, Agent, or Firm*—Finnegan, Henderson, Farabow, Garrett & Dunner, L.L.P.

(57) ABSTRACT

A magnetic random access memory includes a magnetoresistive effect element having a fixed layer in which a magnetization direction is fixed, a recording layer in which a magnetization direction is reversible, and a nonmagnetic layer formed between the fixed layer and the recording layer, a hollow portion being formed in a center of the recording layer, and the magnetization directions in the fixed layer and the recording layer taking one of a parallel state and an antiparallel state in accordance with a direction of an electric current supplied between the fixed layer and the recording layer, an insulating layer formed in the hollow portion, a wiring connected to one terminal of the magnetoresistive effect element, and a transistor connected to the other terminal of the magnetoresistive effect element.

9 Claims, 5 Drawing Sheets

MAGNETIC RANDOM ACCESS MEMORY AND METHOD OF MANUFACTURING THE SAME

CROSS-REFERENCE TO RELATED APPLICATIONS

This application is based upon and claims the benefit of priority from prior Japanese Patent Application No. 2006-280481, filed Oct. 13, 2006, the entire contents of which are incorporated herein by reference.

BACKGROUND OF THE INVENTION

1. Field of the Invention

The present invention relates to a spin-transfer magnetization reversal type magnetic random access memory (MRAM), and a method of manufacturing the same.

2. Description of the Related Art

A magnetic random access memory (MRAM) that uses magnetization reversal by the spin transfer method as a write operation is regarded as more advantageous than current magnetic field write in view of, e.g., micropatterning of cells and the prevention of a write error to an adjacent cell. A minimum processing dimension of lithography determines the area of a magnetic tunnel junction (MTJ) element used in this magnetic random access memory.

In spin-transfer write, however, the current density needed for magnetization reversal is as high as $1 \times 10^7$ A/cm$^2$. This poses the big problem that the amount of electric current that must be supplied to the MTJ element is large for a practical use. Accordingly, the spin-transfer magnetization reversal type magnetic random access memory is required to realize an element area independent of a minimum processing dimension of lithography.

Note that pieces of prior art reference information relevant to the invention of this application are as follows.

[Patent reference 1] Jpn. Pat. Appln. KOKAI Publication No. 2004-259913

[Patent reference 2] Jpn. Pat. Appln. KOKAI Publication No. 2001-084758

[Patent reference 3] Jpn. Pat. Appln. KOKAI Publication No. 2004-139681

[Patent reference 4] Jpn. Pat. Appln. KOKAI Publication No. 2004-193479

[Patent reference 5] Jpn. Pat. Appln. KOKAI Publication No. 2003-273331

BRIEF SUMMARY OF THE INVENTION

A magnetic random access memory according to the first aspect of the present invention comprises a magnetoresistive effect element having a fixed layer in which a magnetization direction is fixed, a recording layer in which a magnetization direction is reversible, and a nonmagnetic layer formed between the fixed layer and the recording layer, a hollow portion being formed in a center of the recording layer, and the magnetization directions in the fixed layer and the recording layer taking one of a parallel state and an antiparallel state in accordance with a direction of an electric current supplied between the fixed layer and the recording layer, an insulating layer formed in the hollow portion, a wiring connected to one terminal of the magnetoresistive effect element, and a transistor connected to the other terminal of the magnetoresistive effect element.

A magnetic random access memory manufacturing method according to the second aspect of the present invention comprises forming a transistor, stacking a fixed layer and a nonmagnetic layer connecting to the transistor, forming and patterning a first insulating layer on the nonmagnetic layer, forming a recording layer on only a side surface of the first insulating layer, and forming a wiring connecting to the recording layer, wherein magnetization directions in the fixed layer and the recording layer take one of a parallel state and an antiparallel state in accordance with a direction of an electric current supplied between the fixed layer and the recording layer.

A magnetic random access memory manufacturing method according to the third aspect of the present invention comprises forming a transistor, stacking a fixed layer and a nonmagnetic layer connecting to the transistor, forming an interlayer insulating film on the nonmagnetic layer, exposing the nonmagnetic layer by forming a trench in the interlayer insulating film, forming a recording layer on only a side surface of the trench, forming an insulating layer in the trench, and forming a wiring connecting to the recording layer, wherein magnetization directions in the fixed layer and the recording layer take one of a parallel state and an antiparallel state in accordance with a direction of an electric current supplied between the fixed layer and the recording layer.

DETAILED DESCRIPTION OF THE INVENTION

An embodiment of the present invention will be explained below with reference to the accompanying drawing. In the following explanation, the same reference numerals denote the same parts throughout the drawing.

[1] Structure of Magnetic Random Access Memory

[1-1] Structural Example 1

Structural example 1 in which a fixed layer and nonmagnetic layer of an MTJ element (magnetoresistive effect element) are disk-like layers and only a recording layer is a ring-like layer will be explained.

Figure 1A:
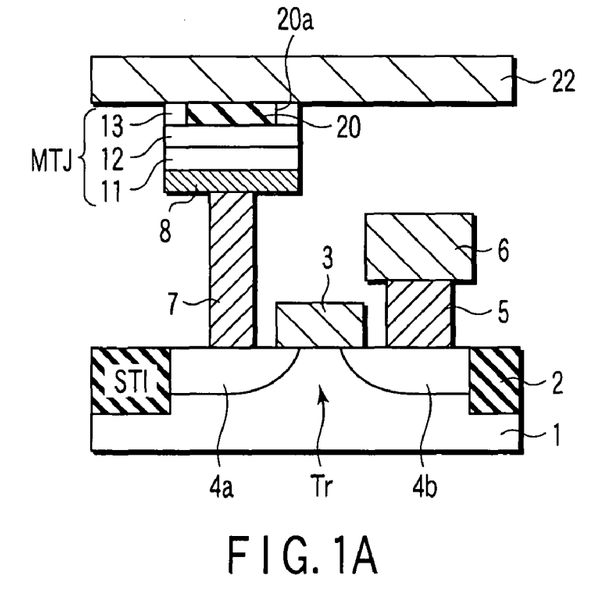
FIG. 1A is a sectional view showing structural example 1 of a magnetic random access memory according to an embodiment of the present invention.
Figure 1B:
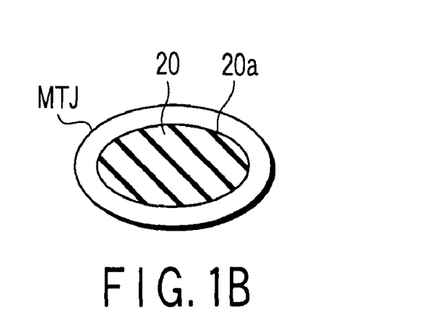
FIG. 1B is a plan view showing the upper surface of an MTJ element shown in FIG. 1A.

FIG. 1A is a sectional view of structural example 1 of a magnetic random access memory according to an embodiment of the present invention. FIG. 1B is a plan view showing the upper surface of an MTJ element shown in FIG. 1A. Structural example 1 of the magnetic random access memory according to the embodiment will be explained below.

As shown in FIGS. 1A and 1B, element isolation regions 2 having a shallow trench isolation (STI) structure are formed in a semiconductor substrate (silicon substrate) 1. A gate electrode 3 is formed on the semiconductor substrate 1 via a gate insulating film (not shown), and source/drain diffusion layers 4a and 4b are formed in the semiconductor substrate 1 on the two sides of the gate electrode 3, thereby forming a transistor (e.g., a MOS transistor) Tr that functions as a switching element.

A contact 5 is connected to the source/drain diffusion layer 4a of the transistor Tr, and a wiring 6 is connected to the contact 5. The wiring 6 is connected to, e.g., the power terminal or ground terminal.

A contact 7 is connected to the source/drain diffusion layer 4b of the transistor Tr, and a lower electrode layer 8 is connected to the contact 7. An MTJ element MTJ is formed on the lower electrode layer 8, and a wiring 22 is connected to the MTJ element MTJ. The wiring 22 is connected to, e.g., the power terminal or ground terminal. The wirings 6 and 22 can run in different directions (in the vertical direction) as shown in FIG. 1A, and can also run in the same direction.

The MTJ element MTJ has a stacked structure in which a fixed layer (pinned layer) 11, nonmagnetic layer 12, and recording layer (free layer) 13 are sequentially stacked. The planar shape of the fixed layer 11 and nonmagnetic layer 12 is, e.g., a disk shape, and that of the recording layer 13 is, e.g., a ring shape. Accordingly, a hollow portion 20a exists in the center of the recording layer 13. An insulating layer 20 fills the hollow portion 20a, and the bottom surface of the insulating layer 20 is in contact with the nonmagnetic layer 12. The recording layer 13 is formed on only the side surface of the insulating layer 20.

Figure 3A:
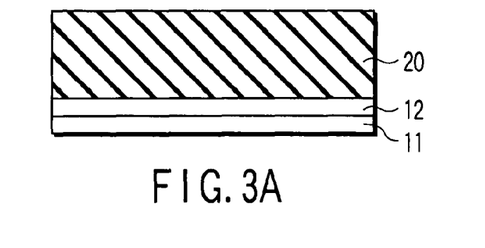
FIGS. 3A to 3G are sectional views showing the manufacturing steps of manufacturing method example 1 of the magnetic random access memory according to the embodiment of the present invention.
Figure 3B:
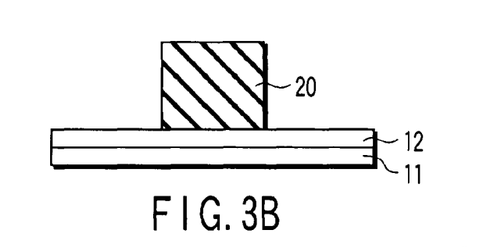
Figure 3C:
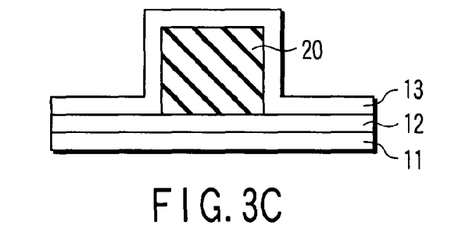
Figure 3D:
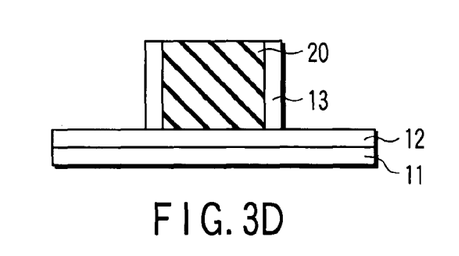
Figure 3E:
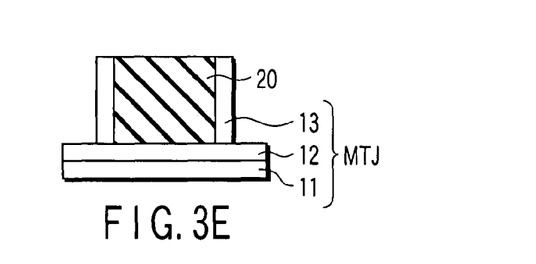
Figure 3F:
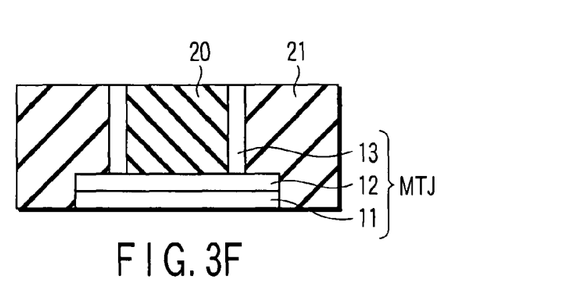
Figure 3G:
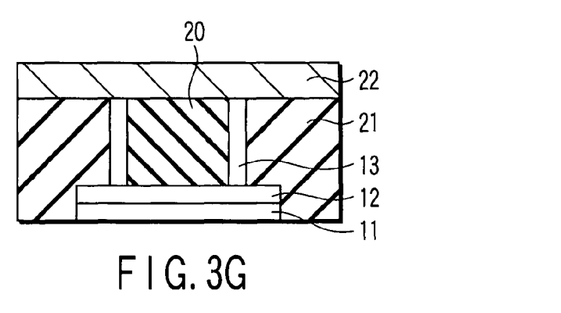

The outside surface of the recording layer 13 can be aligned with the side surfaces of the fixed layer 11 and nonmagnetic layer 12 (e.g., FIG. 1A), or positioned inside the side surfaces of the fixed layer 11 and nonmagnetic layer 12 (e.g., FIG. 3G).

The film thickness in the stacking direction of the recording layer 13 can be smaller than that of the fixed layer 11, or larger than that of the fixed layer 11 (e.g., FIG. 3G).

[1-2] Structural Example 2

Structural example 2 in which all of a fixed layer, nonmagnetic layer, and recording layer of an MTJ element are ring-like layers will be explained.

Figure 2A:
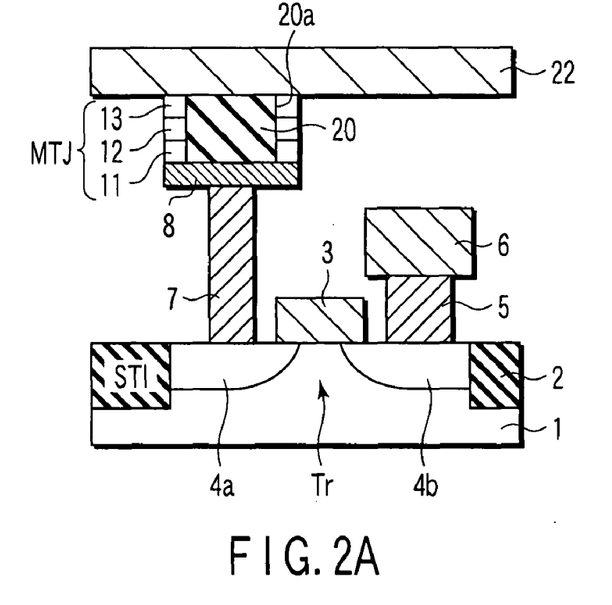
FIG. 2A is a sectional view showing structural example 2 of the magnetic random access memory according to the embodiment of the present invention.
Figure 2B:
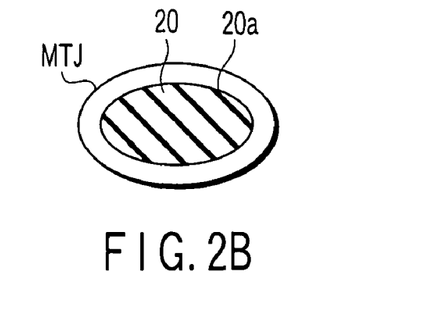
FIG. 2B is a plan view showing the upper surface of an MTJ element shown in FIG. 2A.

FIG. 2A is a sectional view of structural example 2 of the magnetic random access memory according to the embodiment of the present invention. FIG. 2B is a plan view showing the upper surface of an MTJ element shown in FIG. 2A.

Structural example 2 of the magnetic random access memory according to the embodiment will be explained below. Note that the difference from structural example 1 will be mainly described, and an explanation of the sameness will be omitted.

As shown in FIGS. 2A and 2B, structural example 2 differs from structural example 1 in that all of a fixed layer 11, nonmagnetic layer 12, and recording layer 13 of the MTJ element are ring-like layers. That is, a hollow portion 20a continuously exists in the centers of the fixed layer 11, nonmagnetic layer 12, and recording layer 13, and an insulating layer 20 is buried in the hollow portion 20a. The bottom surface of the insulating layer 20 is in contact with a lower metal layer 8. The fixed layer 11, nonmagnetic layer 12, and recording layer 13 are formed on only the side surface of the insulating layer 20.

The side surfaces of the fixed layer 11, nonmagnetic layer 12, and recording layer 13 can be aligned with each other (e.g., FIGS. 2A and 5I), or have steps.

Figures 5A, 5B, 5C, 5D, 5E, 5F, 5G, 5H, 5I:
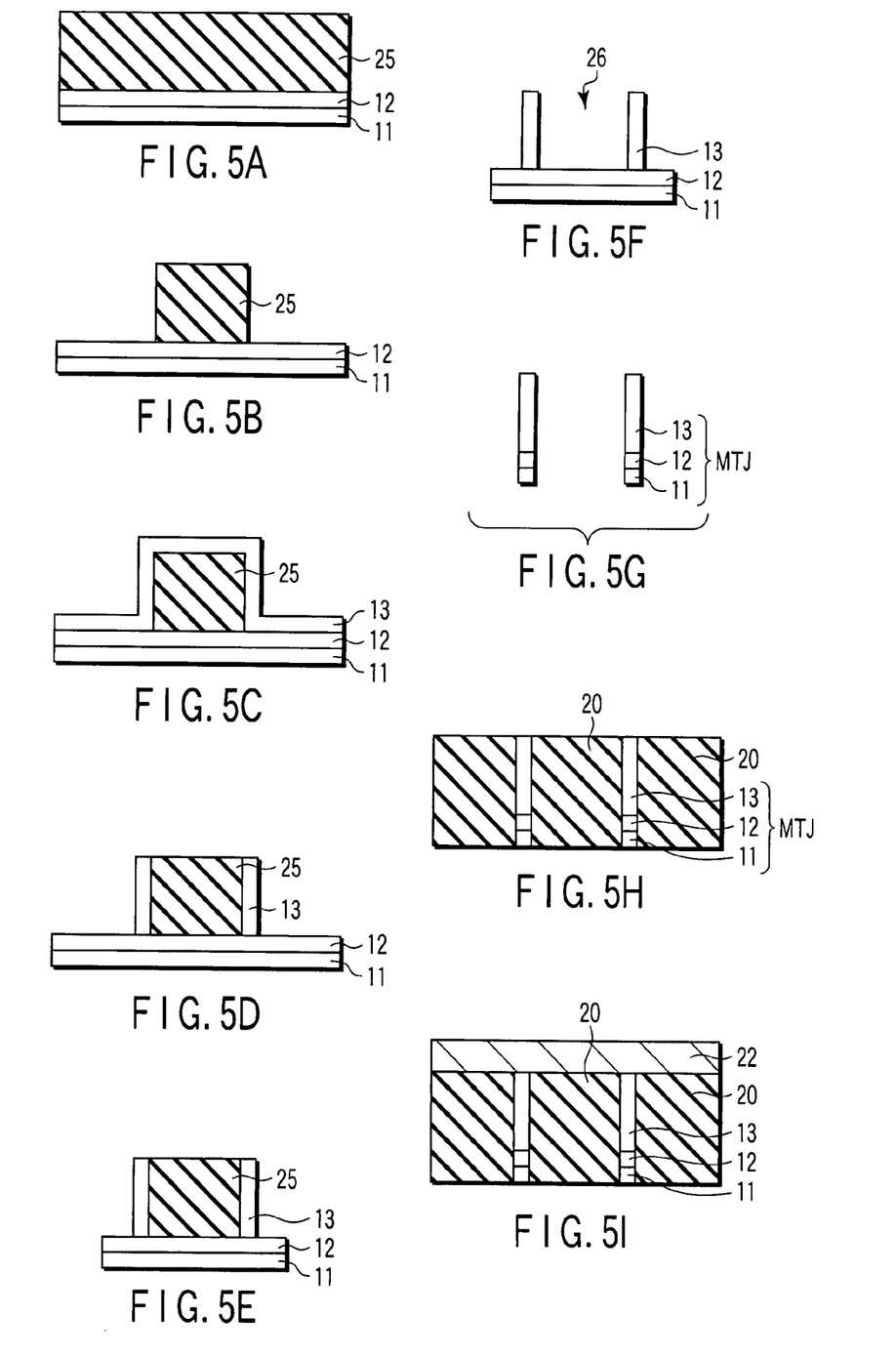
FIGS. 5A to 5I are sectional views showing the manufacturing steps of manufacturing method example 3 of the magnetic random access memory according to the embodiment of the present invention.

The film thickness in the stacking direction of the recording layer 13 can be smaller than that of the fixed layer 11, or larger than that of the fixed layer 11 (e.g., FIG. 5I).

Note that a structure in which only the nonmagnetic layer 12 and recording layer 13 are ring-like layers can also be formed instead of structural examples 1 and 2.

[2] Magnetic Random Access Memory Manufacturing Method

[2-1] Manufacturing Method Example 1

Manufacturing method example 1 implements structural example 1 shown in FIGS. 1A and 1B.

FIGS. 3A to 3G are sectional views showing the manufacturing steps of manufacturing method example 1 of the magnetic random access memory according to the embodiment of the present invention. Manufacturing method example 1 of the magnetic random access memory according to the embodiment of the present invention will be explained below.

First, as shown in FIG. 3A, after a transistor (not shown) is formed, a fixed layer 11 and nonmagnetic layer 12 are sequentially deposited on a lower metal layer 8 (not shown). The nonmagnetic layer 12 is made of, e.g., an $Al_2O_3$ film. Then, an insulating layer 20 made of, e.g., $SiO_2$ or SiN is deposited on the nonmagnetic layer 12. Note that the material of the insulating layer 20 can be different from that of the nonmagnetic layer 12 as described above, but can also be the same as that of the nonmagnetic layer 12.

Next, as shown in FIG. 3B, the insulating layer 20 is patterned into a predetermined shape (e.g., a circle) by anisotropic etching such as reactive ion etching (RIE). In this step, the insulating layer 20 is processed by a minimum processing dimension of lithography.

As shown in FIG. 3C, a recording layer 13 is deposited on the insulating layer 20 and nonmagnetic layer 12. In this step, the film thickness of the insulating layer 20 adjusts the film thickness in the stacking direction of the recording layer 13.

As shown in FIG. 3D, the recording layer 13 is partially removed and left behind on only the side surface of the insulating layer 20 by anisotropic etching such as RIE. This exposes the insulating layer 20 and nonmagnetic layer 12.

As shown in FIG. 3E, the nonmagnetic layer 12 and fixed layer 11 are patterned into a predetermined shape (e.g., a circle). This forms an MTJ element MTJ in which the nonmagnetic layer 12 and fixed layer 11 are, e.g., disk-like layers and only the recording layer 13 is, e.g., a ring-like layer.

As shown in FIG. 3F, an interlayer insulating film 21 made of $SiO_2$ or the like is deposited on the insulating layer 20 and recording layer 13. After that, the interlayer insulating film 21 is planarized by, e.g., chemical mechanical polishing (CMP), thereby exposing the insulating layer 20 and recording layer 13. The material of the interlayer insulating film 21 can be the same as or different from that of the insulating film 20.

As shown in FIG. 3G, a wiring 22 is formed on the interlayer insulating film 21, insulating layer 20, and recording layer 13, and electrically connected to the recording layer 13.

Manufacturing method example 1 as described above can form structural example 1 shown in FIGS. 1A and 1B. ps [2-2] Manufacturing Method Example 2

Manufacturing method example 2 implements structural example 1 shown in FIGS. 1A and 1B.

FIGS. 4A to 4G are sectional views showing the manufacturing steps of manufacturing method example 2 of the magnetic random access memory according to the embodiment of the present invention. Manufacturing method example 2 of the magnetic random access memory according to the embodiment of the present invention will be explained below.

Figure 4A:
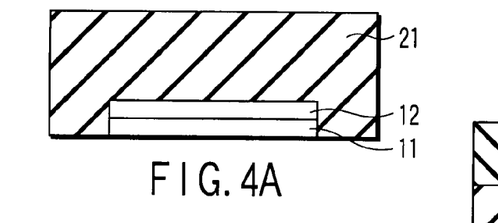
FIGS. 4A to 4G are sectional views showing the manufacturing steps of manufacturing method example 2 of the magnetic random access memory according to the embodiment of the present invention.

First, as shown in FIG. 4A, after a transistor (not shown) is formed, a fixed layer 11 and nonmagnetic layer 12 are sequentially deposited on a lower metal layer 8 (not shown). The nonmagnetic layer 12 is made of, e.g., an $Al_2O_3$ film. Then, the nonmagnetic layer 12 and fixed layer 11 are patterned into a predetermined shape (e.g., a disk shape). After that, an interlayer insulating film 21 made of $SiO_2$ or the like is deposited on the nonmagnetic layer 12.

Figure 4B:
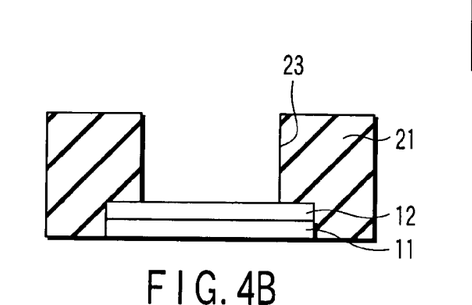

Next, as shown in FIG. 4B, a trench 23 is formed in the interlayer insulating film 21 by anisotropic etching such as RIE, thereby exposing the nonmagnetic layer 12.

Figure 4C:
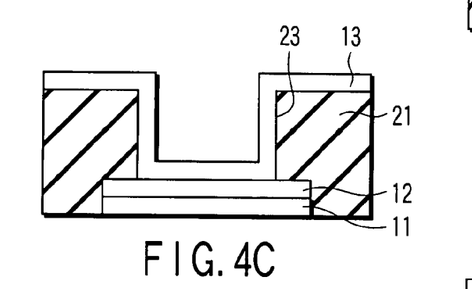

As shown in FIG. 4C, a recording layer 13 is deposited in the trench 23 and on the interlayer insulating film 21.

Figure 4D:
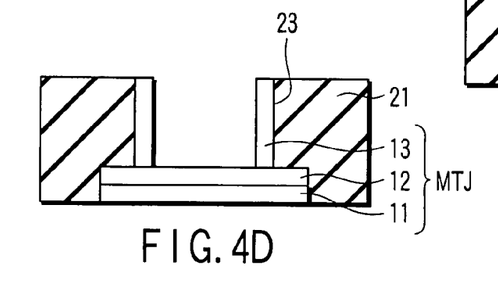

As shown in FIG. 4D, the recording layer 13 is partially removed by anisotropic etching such as RIE, thereby exposing the interlayer insulating film 21 and nonmagnetic layer 12. This forms an MTJ element MTJ in which the recording layer 13 remains on only the side surface of the trench 23, the nonmagnetic layer 12 and fixed layer 11 are, e.g., disk-like layers, and only the recording layer 13 is, e.g., a ring-like layer. Note that the depth of the trench 23 adjusts the film thickness in the stacking direction of the recording layer 13.

Figure 4E:
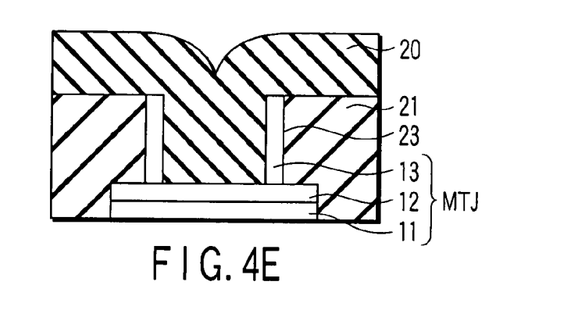

As shown in FIG. 4E, an insulating layer 20 made of, e.g., $SiO_2$ or SiN is formed in the trench 23 and on the interlayer insulating film 21. Note that the material of the insulating layer 20 can be different from that of the nonmagnetic layer 12 as described above, but can also be the same as that of the nonmagnetic layer 12. Note also that the material of the insulating layer 20 can be the same as or different from that of the interlayer insulating film 21.

Figure 4F:
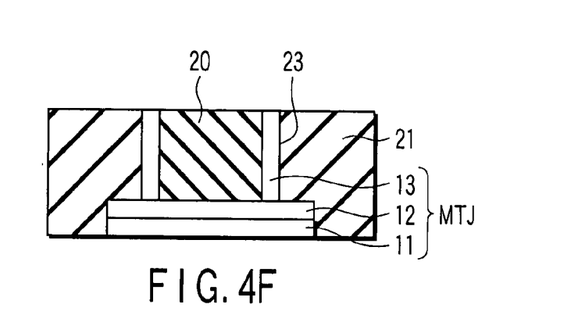

As shown in FIG. 4F, the insulating layer 20 is planarized by CMP or the like, thereby exposing the interlayer insulating film 21 and recording layer 13.

Figure 4G:
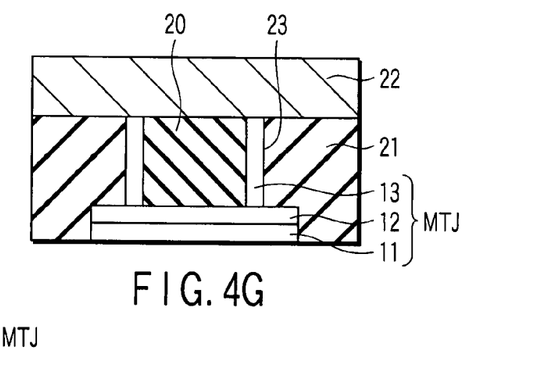

As shown in FIG. 4G, a wiring 22 is formed on the interlayer insulating film 21, insulating layer 20, and recording layer 13, and electrically connected to the recording layer 13.

Manufacturing method example 2 as described above can form structural example 1 shown in FIGS. 1A and 1B.

Manufacturing method example 1 is a method of forming the recording layer 13 on the side surface of the insulating layer 20, but manufacturing method example 2 is a method of forming the recording layer 13 on the side surface of the trench 23 in the interlayer insulating film 21. When processing a material for which no etching gas has been developed, therefore, manufacturing method example 1 facilitates physical etching such as ion milling because there is no surrounding obstacle. On the other hand, manufacturing method example 2 facilitates planarization because the process such as CMP is easy to use.

[2-3] Manufacturing Method Example 3

Manufacturing method example 3 implements structural example 2 shown in FIGS. 2A and 2B.

FIGS. 5A to 5I are sectional views showing the manufacturing steps of manufacturing method example 3 of the magnetic random access memory according to the embodiment of the present invention. Manufacturing method example 3 of the magnetic random access memory according to the embodiment of the present invention will be explained below.

First, as shown in FIG. 5A, after a transistor (not shown) is formed, a fixed layer 11 and nonmagnetic layer 12 are sequentially deposited on a lower metal layer 8 (not shown). The nonmagnetic layer 12 is made of, e.g., an $Al_2O_3$ film. Then, an insulating layer 25 made of, e.g., $SiO_2$ or SiN is deposited on the nonmagnetic layer 12.

Next, as shown in FIG. 5B, the insulating layer 25 is patterned into a predetermined shape (e.g., a circle) by anisotropic etching such as RIE. In this step, the insulating layer 25 is processed by a minimum processing dimension of lithography.

As shown in FIG. 5C, a recording layer 13 is deposited on the insulating layer 25 and nonmagnetic layer 12. In this step, the film thickness of the insulating layer 25 adjusts the film thickness in the stacking direction of the recording layer 13.

As shown in FIG. 5D, the recording layer 13 is partially removed and left behind on only the side surface of the insulating layer 25 by anisotropic etching such as RIE. This exposes the insulating layer 25 and nonmagnetic layer 12.

As shown in FIG. 5E, the nonmagnetic layer 12 and fixed layer 11 are patterned into a predetermined shape (e.g., a disk shape).

As shown in FIG. 5F, the insulating layer 25 is removed. This forms a hollow in the center of the recording layer 13, thereby forming a trench 26.

As shown in FIG. 5G, the recording layer 13 is used as a mask to pattern the nonmagnetic layer 12 and fixed layer 11. This forms a hollow portion in the centers of the nonmagnetic layer 12 and fixed layer 11, as in the recording layer 13. In this manner, an MTJ element MTJ in which all the recording layer 13, nonmagnetic layer 12, and fixed layer 11 are ring-like layers is formed.

As shown in FIG. 5H, an insulating layer 20 made of, e.g., $SiO_2$ or SiN is deposited on the recording layer 13. After that, the insulating layer 20 is planarized by CMP or the like, thereby exposing the recording layer 13. In this step, the insulating layer 20 forms both the inside and outside insulating films of the ring-like MTJ element MTJ. Note that the material of the insulating layer 20 can be different from that of the nonmagnetic layer 12 as described above, but can also be the same as that of the nonmagnetic layer 12.

As shown in FIG. 5I, a wiring 22 is formed on the insulating layer 20 and recording layer 13, and electrically connected to the recording layer 13.

Manufacturing method example 3 as described above can form structural example 2 shown in FIGS. 2A and 2B.

[3] MTJ Element MTJ

[3-1] Materials

The MTJ element MTJ is made of, e.g., the following materials.

Favorable examples of the materials of the fixed layer 11 and recording layer 13 are Fe, Co, Ni, and their alloys, magnetite having a large spin polarization ratio, oxides such as $CrO_2$ and $RXMnO_{3-y}$ (R; rare earth element, X; Ca, Ba, and Sr), and Heusler alloys such as NiMnSb and PtMnSb. These magnetic materials can more or less contain nonmagnetic elements such as Ag, Cu, Au, Al, Mg, Si, Bi, Ta, B, C, O, N, Pd, Pt, Zr, Ir, W, Mo, and Nb, provided that the materials do not loose ferromagnetism.

As the material of the nonmagnetic layer 12, it is possible to use various dielectrics such as $Al_2O_3$, $SiO_2$, MgO, AlN, $Bi_2O_3$, $MgF_2$, $CaF_2$, $SrTiO_2$, and $AlLaO_3$. These dielectrics may have oxygen, nitrogen, and fluorine deficiencies.

An antiferromagnetic layer for fixing the magnetization direction in the fixed layer 11 can also be formed on the side of the fixed layer 11 away from the nonmagnetic layer 12. As the material of this antiferromagnetic layer, it is favorable to use, e.g., Fe—Mn, Pt—Mn, Pt—Cr—Mn, Ni—Mn, Ir—Mn, NiO, or $Fe_2O_3$.

Note that the insulating layer 20 need only be an insulating material, and this insulating material can be the same as or different from the material of the nonmagnetic layer 12.

[3-2] Parallel Magnetization Type

Figure 6A:
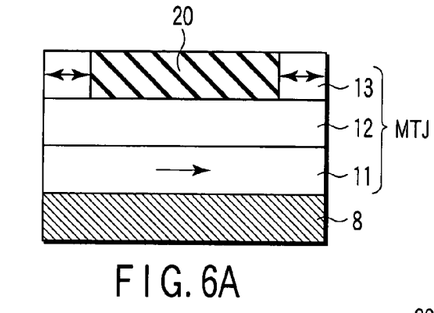
FIG. 6A is a sectional view showing a parallel magnetization type MTJ element according to the embodiment of the present invention.
Figure 6B:
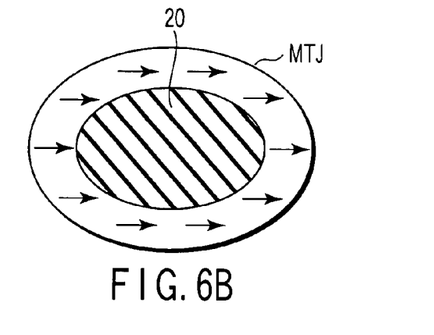
FIG. 6B is a plan view showing the upper surface of the MTJ element shown in FIG. 6A.

FIG. 6A is a sectional view of a parallel magnetization type MTJ element according to the embodiment of the present invention. FIG. 6B is a plan view showing the upper surface of the MTJ element shown in FIG. 6A.

As shown in FIG. 6A, when the MTJ element MTJ is viewed sideways, the magnetization directions in the fixed layer 11 and recording layer 13 of the MTJ element MTJ can be parallel to the film surface. A magnetization arrangement like this will be referred to as a parallel magnetization type hereinafter.

As shown in FIG. 6B, when the MTJ element MTJ shown in FIG. 6A is viewed from above, the magnetization in the fixed layer 11 and recording layer 13 of the MTJ element MTJ points in one direction (to the right in the paper). That is, the magnetization in the fixed layer 11 and recording layer 13 does not point in a direction corresponding to the shape of the fixed layer 11 and recording layer 13. This is so because this embodiment assumes an MTJ element MTJ that uses material magnetic anisotropy rather than shape magnetic anisotropy. Accordingly, the magnetization in the ring-like recording layer 13 does not point in the clockwise or counterclockwise direction along the ring-like shape, but points in one discontinuous direction (a direction that does not close).

Note that the one discontinuous direction of magnetization in the MTJ element MTJ can be variously changed. Examples are the direction in which the wiring 22 positioned on the MTJ element MTJ runs, and the direction perpendicular to this direction in which the wiring 22 runs.

[3-3] Perpendicular Magnetization Type

Figure 7:
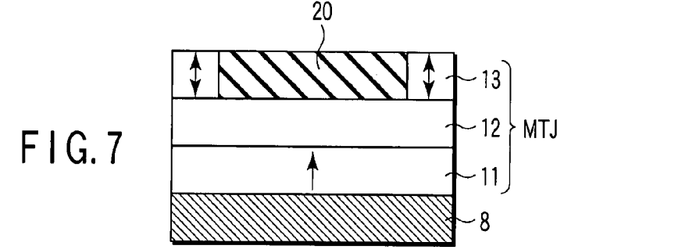
FIG. 7 is a sectional view showing a perpendicular magnetization type MTJ element according to the embodiment of the present invention.

FIG. 7 is a sectional view of a perpendicular magnetization type MTJ element according to the embodiment of the present invention.

As shown in FIG. 7, when the MTJ element MTJ is viewed sideways, the magnetization directions in the fixed layer 11 and recording layer 13 of the MTJ element MTJ can be perpendicular to the film surface. A magnetization arrangement like this will be referred to as a perpendicular magnetization type hereinafter. In the perpendicular magnetization type MTJ element MTJ, the longitudinal direction of the element shape does not determine the magnetization direction unlike in the conventional elements.

Examples of a perpendicular magnetic material like this are as follows.

First, a magnetic material having a high coercive force to be used as the perpendicular magnetic material of the fixed layer 11 and recording layer 13 is made of a material having a high magnetic anisotropic energy density of $1 \times 10^6$ erg/cc or more. Examples of the material will be explained below.

EXAMPLE 1

"A material made of an alloy containing at least one of Fe (iron), Co (cobalt), and Ni (nickel) and at least one of Cr (chromium), Pt (platinum), and Pd (palladium)"

Examples of an ordered alloy are Fe(50)Pt(50), Fe(50)Pd (50), and Co(50)Pt(50). Examples of a random alloy are a CoCr alloy, CoPt alloy, CoCrPt alloy, CoCrPtTa alloy, and CoCrNb alloy.

EXAMPLE 2

"A material having a structure in which at least one of Fe, Co, and Ni or an alloy containing one of these elements and at least one of Pd and Pt or an alloy containing one of these elements are alternately stacked"

Examples are a Co/Pt artificial lattice, Co/Pd artificial lattice, and CoCr/Pt artificial lattice. When the Co/Pt artificial lattice or Co/Pd artificial lattice is used, a high resistance change ratio (MR ratio) of about 40% can be achieved.

EXAMPLE 3

"An amorphous alloy containing at least one rare earth metal such as Tb (terbium), Dy (dysprosium), or Gd (gadolinium), and at least one transition metal"

Examples are TbFe, TbCo, TbFeCo, DyTbFeCo, and GdTbCo.

The recording layer 13 can be made of the magnetic material having a high coercive force as described above, and can also be made of a magnetic material having a magnetic anisotropic energy density lower than that of the magnetic material having a high coercive force as described above, by adjusting the composition ratio, adding an impurity, or adjusting the thickness. Examples of the material will be explained below.

EXAMPLE 1

"A material obtained by adding an impurity to an alloy containing at least one of Fe, Co, and Ni and at least one of Cr, Pt, and Pd"

An example of an ordered alloy is a material obtained by decreasing the magnetic anisotropic energy density by adding an impurity such as Cu, Cr, or Ag to Fe(50)Pt(50), Fe(50)Pd (50), or Co(50)Pt(50). An example of a random alloy is a material obtained by decreasing the magnetic anisotropic energy density by increasing the ratio of a nonmagnetic element in a CoCr alloy, CoPt alloy, CoCrPt alloy, CoCrPtTa alloy, or CoCrNb alloy.

EXAMPLE 2

"A material having a structure in which at least one of Fe, Co, and Ni or an alloy containing one of these elements and at least one of Pd and Pt or an alloy containing one of these elements are alternately stacked, and the thickness of the layer made of the former element or alloy or the thickness of the layer made of the latter element or alloy is adjusted"

The thickness of the layer made of at least one of Fe, Co, and Ni or an alloy containing one of these elements has an optimum value, and the thickness of the layer made of at least one of Pd and Pt or an alloy containing one of these elements has an optimum value. As the thicknesses deviate from these optimum values, the magnetic anisotropic energy density decreases.

EXAMPLE 3

"A material obtained by adjusting the composition ratio of an amorphous alloy containing at least one rare earth metal such as Tb (terbium), Dy (dysprosium), or Gd (gadolinium) and at least one transition metal"

An example is a material obtained by decreasing the magnetic anisotropic energy density by adjusting the composition ratio of an amorphous alloy such as TbFe, TbCo, TbFeCo, DyTbFeCo, or GdTbCo.

[3-4] Planar Shape

Figure 8A:
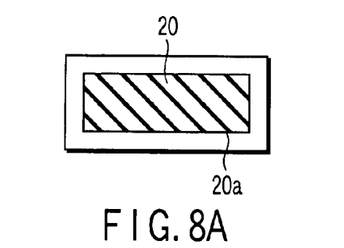
FIG. 8A is a plan view showing a rectangular MTJ element according to the embodiment of the present invention.
Figure 8B:
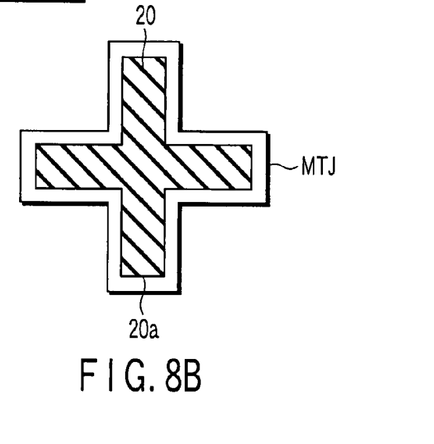
FIG. 8B is a plan view showing a cross-shaped MTJ element according to the embodiment of the present invention.

The planar shape of the MTJ element MTJ can be variously changed. Examples are a rectangle (FIG. 8A), square, ellipse, circle, hexagon, rhomb, parallelogram, cross (FIG. 8B), and bean (recessed shape).

As the parallel magnetization type MTJ element MTJ, this embodiment assumes an MTJ element MTJ using material magnetic anisotropy rather than shape magnetic anisotropy. When using shape magnetic anisotropy, the longitudinal direction (magnetic easy axis direction) of the MTJ element MTJ is desirably about 2 F if the widthwise direction (magnetic hard axis direction) is F (a minimum processing dimension).

The perpendicular magnetization type MTJ element MTJ can have any of the above shapes because the magnetization direction is independent of the shape.

[3-5] Tunnel Junction Structure

The MTJ element MTJ can have a single tunnel junction (single-junction) structure or double tunnel junction (double-junction) structure.

As shown in FIG. 1A and the like, the MTJ element MTJ having the single tunnel junction structure has the fixed layer 11, the recording layer 13, and the nonmagnetic layer 12 formed between the fixed layer 11 and recording layer 13. That is, the MTJ element MTJ has one nonmagnetic layer.

The MTJ element MTJ having the double tunnel junction structure has a first fixed layer, a second fixed layer, a recording layer formed between the first and second fixed layers, a first nonmagnetic layer formed between the first fixed layer and recording layer, and a second nonmagnetic layer formed between the second fixed layer and recording layer. That is, the MTJ element MTJ has two nonmagnetic layers.

When the same external bias is applied, the magnetoresistive (MR) ratio (the resistance change ratio of state 1 to state 0) decreases less in the double tunnel junction structure than in the single tunnel junction structure, so the former can operate with a higher bias than the latter. That is, the double tunnel junction structure is advantageous in reading information from a cell.

Note that when structural example 1 shown in FIGS. 1A and 1B is given the double tunnel junction structure, the disk-like fixed layer and nonmagnetic layer sandwich the ring-like recording layer.

[4] Write Operation of Magnetic Random Access Memory

In the magnetic random access memory according to the embodiment of the present invention, data write is performed using spin-transfer magnetization reversal. In the MTJ element MTJ, therefore, the magnetization directions in the fixed layer 11 and recording layer 13 become parallel or antiparallel in accordance with the direction of an electric current I supplied between the fixed layer 11 and recording layer 13. Details are as follows.

When writing binary 1, the electric current I is supplied in the direction from the fixed layer 11 to the recording layer 13 of the MTJ element MTJ. That is, electrons e are injected from the recording layer 13 into the fixed layer 11. This makes the magnetization directions in the fixed layer 11 and recording layer 13 opposite, i.e., antiparallel. A high-resistance state Rap like this is defined as binary 1.

When writing binary 0, the electric current I is supplied in the direction from the recording layer 13 to the fixed layer 11 of the MTJ element MTJ. That is, the electrons e are injected from the fixed layer 11 into the recording layer 13. This makes the magnetization directions in the fixed layer 11 and recording layer 13 the same, i.e., parallel. A low-resistance state Rp like this is defined as binary 0.

[5] Read Operation of Magnetic Random Access Memory

A read operation of the magnetic random access memory according to the embodiment of the present invention uses the magnetoresistive effect.

The transistor Tr connecting to the MTJ element MTJ of a selected cell is turned on to supply a read current from, e.g., the wiring 22 to the transistor Tr through the MTJ element MTJ. Whether the binary value is 1 or 0 is determined by the resistance value of the MTJ element MTJ read on the basis of this read current.

Note that the read operation can be performed by reading a current value by applying a constant voltage, or by reading a voltage value by applying a constant current.

[6] Effect

The embodiment of the present invention can reduce the element area compared to the conventional elements because the hollow portion 20a exists in at least the center of the recording layer 13 of the MTJ element MTJ. In the structure shown in FIG. 1A, for example, the width in the horizontal direction of the film surface of the recording layer 13 can be the same as the deposited film thickness, and can be made smaller than the width in the horizontal direction of the film surface of the fixed layer 11 and nonmagnetic layer 12. Accordingly, a minimum processing dimension of lithography does not define the width in the horizontal direction of the film surface of the recording layer 13, unlike in the conventional elements. Since the area of the spin-transfer type MTJ element MTJ can be reduced as described above, the value of the write current can be decreased.

[7] Phase-change Memory

The structure of the storage element according to the embodiment of the present invention described above is also applicable to, e.g., a phase-change memory (phase-change random access memory [PRAM]).

Figure 9A:
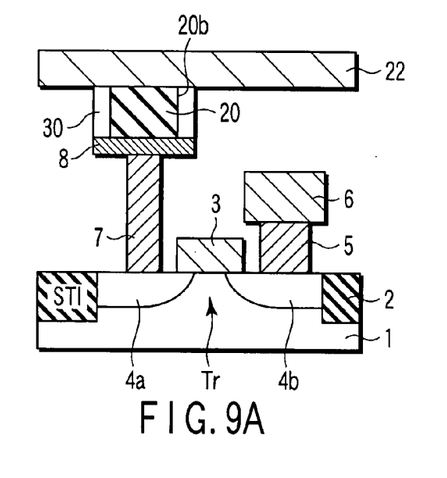
FIG. 9A is sectional view showing a phase-change memory according to the embodiment of the present invention.
Figure 9B:
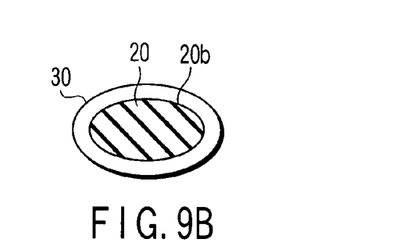
FIG. 9B is a plan view showing a MTJ element according to the embodiment of the present invention.

FIG. 9 is a sectional view of a phase-change memory according to the embodiment of the present invention. This phase-change memory according to the embodiment of the present invention will be briefly described below. Note that the difference from the magnetic random access memory will be mainly explained below, and an explanation of the sameness will be omitted.

As shown in FIG. 9, the phase-change memory differs from the magnetic random access memory in that the memory uses a phase-change element that uses a crystal phase-change film 30 instead of the MTJ element. A hollow portion 20b exists in the center of the phase-change film 30, and an insulating layer 20 is buried in the hollow portion 20b. The bottom surface of the insulating layer 20 is in contact with a lower metal layer 8, and the phase-change film 30 is formed on only the side surface of the insulating layer 20.

The phase-change film 30 is made of, e.g., chalcogenide. An electric current is vertically supplied in the order of wiring 22→phase-change film 30→lower metal layer 8→contact 7. This causes a high-resistance material (e.g., a barrier metal material such as W or TiN) used as the lower metal layer 8 and contact 7 to function as a heater, and the heated chalcogenide changes to be amorphous or crystalline. The crystalline chalcogenide has a low resistance, but the amorphous chalcogenide has a high resistance. Binary values 1 and 0 are assigned by using this resistance difference.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
a substrate;
a magnetoresistive effect element formed above the substrate and having a fixed layer in which a magnetization direction is fixed, a recording layer in which a magnetization direction is reversible, and a nonmagnetic layer formed between the fixed layer and the recording layer, a hollow portion being formed in a center of the recording layer, and the magnetization directions in the fixed layer and the recording layer taking one of a parallel state and an antiparallel state, which are perpendicular to an upper surface of the substrate, in accordance with a direction of an electric current supplied between the fixed layer and the recording layer;
an insulating layer formed in the hollow portion;
a wiring connected to one terminal of the magnetoresistive effect element; and
a transistor formed in the substrate and connected to the other terminal of the magnetoresistive effect element.

2. The memory according to claim 1, wherein
a planar shape of the recording layer is a ring shape, and
a planar shape of the fixed layer and the nonmagnetic layer is a disk shape.

3. The memory according to claim 1, wherein when the magnetoresistive effect element is viewed from above, the magnetization direction in the recording layer is one discontinuous direction regardless of a shape of the recording layer.

4. The memory according to claim 1, wherein an outside surface of the recording layer is positioned inside side surfaces of the fixed layer and the nonmagnetic layer.

5. The memory according to claim 1, wherein in a direction in which the fixed layer, the nonmagnetic layer, and the recording layer are stacked, a film thickness of the recording layer is larger than a film thickness of the fixed layer.

6. The memory according to claim 1, wherein in a direction in which the fixed layer, the nonmagnetic layer, and the recording layer are stacked, a film thickness of the recording layer is smaller than a film thickness of the fixed layer.

7. The memory according to claim 1, wherein
the hollow portion continuously exists in centers of the fixed layer and the nonmagnetic layer, and
the fixed layer, the nonmagnetic layer, and the recording layer are formed on a side surface of the insulating layer.

8. The memory according to claim 7, wherein a planar shape of the fixed layer, the nonmagnetic layer, and the recording layer is a ring shape.

9. The memory according to claim 7, further comprising an interlayer insulating film formed around the magnetoresistive effect element by the same layer as the insulating layer.

* * * * *